(12) United States Patent
Kogami et al.

(10) Patent No.: US 7,045,863 B2
(45) Date of Patent: May 16, 2006

(54) SEMICONDUCTOR DEVICE

(75) Inventors: Toshihiro Kogami, Kyoto (JP); Katsuhiro Ootani, Nara (JP); Katsuya Arai, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/028,581

(22) Filed: Jan. 5, 2005

(65) Prior Publication Data

US 2005/0167739 A1 Aug. 4, 2005

(30) Foreign Application Priority Data

Jan. 21, 2004 (JP) .............................. 2004-013096

(51) Int. Cl.
*H01L 23/62* (2006.01)
(52) U.S. Cl. ...................... 257/355; 257/356; 257/360; 257/363
(58) Field of Classification Search ................ 257/356, 257/358, 363
See application file for complete search history.

(56) References Cited

U.S. PATENT DOCUMENTS

| | | | | |
|---|---|---|---|---|
| 4,825,280 | A * | 4/1989 | Chen et al. .................. | 257/659 |
| 5,262,344 | A * | 11/1993 | Mistry ......................... | 438/200 |
| 6,429,079 | B1 * | 8/2002 | Maeda et al. ............... | 438/281 |
| 2001/0016380 | A1 * | 8/2001 | Watanabe et al. ........... | 438/237 |
| 2002/0028522 | A1 * | 3/2002 | Porter et al. .................. | 438/1 |
| 2003/0006463 | A1 * | 1/2003 | Ichikawa ..................... | 257/355 |
| 2003/0151096 | A1 * | 8/2003 | Okawa et al. ............... | 257/355 |

FOREIGN PATENT DOCUMENTS

| | | |
|---|---|---|
| JP | 2-271674 | 11/1990 |
| JP | 2-271873 | 11/1990 |
| JP | 2773220 | 4/1998 |
| JP | 2773221 | 4/1998 |
| JP | 2004221441 A * | 8/2004 |
| WO | WO 01/50533 A1 | 7/2001 |

* cited by examiner

*Primary Examiner*—Allan R. Wilson
*Assistant Examiner*—William Kraig
(74) *Attorney, Agent, or Firm*—McDermott Will & Emery LLP

(57) ABSTRACT

An electrostatic discharge protected transistor of the present invention includes transistors in an active region composed of a p-type semiconductor substrate and surrounded by element isolation regions. On the active region composed of the p-type semiconductor substrate, an on-source silicide film and an on-drain silicide film are provided. The on-drain silicide film is not provided in a portion located on a boundary of each transistor and divided to correspond to the respective transistors. As a result, regions between respective pairs of the transistors have high resistances, and it is, therefore, possible to prevent a current from flowing between the different transistors and prevent local current concentration. It is thereby possible to allow the electrostatic discharge protected transistor to make most use of an electrostatic destruction protection capability per unit area without increasing an area of the transistor.

19 Claims, 11 Drawing Sheets

SEMICONDUCTOR DEVICE

CROSS REFERENCE TO RELATED APPLICATIONS

This application claims priority under 35 U.S.C §119 on Patent Application No. 2004-013096 filed in Japan on Jan. 21, 2004, the entire contents of which are hereby incorporated by reference.

BACKGROUND OF THE INVENTION

The present invention relates to a semiconductor device. More specifically, the present invention relates to an electrostatic discharge protected transistor.

In recent years, a silicide structure has been widely adopted for a semiconductor device so as to prevent an increase in parasitic resistance due to a reduction in a thickness of a diffused layer following a scale down of a metal oxide semiconductor (MOS) device. Since the silicide structure has the property of reducing diffusion resistance, the parasitic resistance can be reduced. However, if a silicide film is formed on a plurality of element formation regions, a current tends to flow between the adjacent element formation regions. Due to this, if the silicide structure is applied to elements, such as electrostatic discharge protected transistors, each of which needs to suddenly carry a high current, in particular, the current disadvantageously concentrates on one point and thermal destruction eventually occurs. Therefore, there is proposed a method for preventing current concentration by sub-dividing the electrostatic discharge protected transistors into sets (semiconductor moats), and keeping a high resistance between the adjacent electrostatic discharge protected transistors (see, for example, U.S. Pat. No. 4,825,280).

A conventional electrostatic discharge protected transistor sub-divided into sets according to the semiconductor moats will now be described with reference to FIGS. 10 and 11A, 11B, and 11C.

FIG. 10 is a plan view which depicts the conventional electrostatic discharge protected transistor which includes a silicide film. FIGS. 11A to 11C are sections that depict the conventional electrostatic discharge protected transistor. Specifically, FIG. 11A is a section taken along a line A4—A4 of FIG. 10, FIG. 11B is a section taken along a line B4—B4 of FIG. 10, and FIG. 11C is a section taken along a line C4—C4 of FIG. 10.

As shown in FIG. 10, the conventional electrostatic discharge protected transistor is constituted so that a plurality of transistors 121, 122 and 123 are arranged to share a common gate electrode among them.

As shown in FIG. 11A, each of the transistors 121 to 123 includes element isolation regions 102 of a shallow trench isolation (STI) structure each of which has an insulating film buried in a trench provided in a p-type semiconductor substrate 101 that consists of silicon, a gate insulating film 103 which is provided on an active region of the p-type semiconductor substrate 101 and which is composed of a silicon oxide film, a gate electrode 104 which is provided on the gate insulating film 103 and which is composed of a doped polysilicon film, and an on-gate silicide film $105_G$ which is formed on the gate electrode 104.

Each of the transistors 121 to 123 also includes n-type low-concentration diffused layers 106 which are formed in regions of the active region of the semiconductor substrate 101 which regions are located below sides of the gate electrode 104, respectively, insulating sidewall spacers 107 which are formed on side surfaces of the gate electrode 104, respectively, an n-type high-concentration drain region $108_D$ ($108_{D1}$, $108_{D2}$, or $108_{D3}$) and an n-type high-concentration source region $108_S$ ($108_{S1}$, $108_{S2}$, or $108_{S3}$) which are formed in regions of the active region of the semiconductor substrate 101 which regions are located below respective sides of the sidewalls 107, an on-drain silicide film $105_D$ ($105_{D1}$, $105_{D2}$, or $105_{D3}$) which is formed on the n-type high-concentration drain region $108_D$, and an on-source silicide film $105_S$ ($105_{S1}$, $105_{S2}$, or $105_{S3}$) which is formed on the n-type high-concentration source region $108_S$.

Further, each transistor includes an interlayer insulating film 109 formed on the semiconductor substrate 101, a drain contact $110_D$ ($110_{D1}$, $110_{D2}$, or $110_{D3}$) which penetrates the interlayer insulating film 109 on the n-type high-concentration drain region $108_D$ and which reaches the on-drain silicide film $105_D$, a source contact $110_S$ ($110_{S1}$, $110_{S2}$, or $110_{S3}$) which penetrates the interlayer insulating film 109 on the n-type high-concentration source region $108_S$ and which reaches the on-source silicide film $105_S$, metal wirings $111_D$ and $111_S$ which are formed on the interlayer insulating film 109 so as to be connected to the drain contact $110_D$ and the source contact $110_S$, respectively, and each of which consists of Al or Al alloy, and an interlayer insulating film 112 formed on the interlayer insulating film 109 and the metal wirings $111_D$ and $111_S$.

With this structure, the on-drain silicide films $105_{D1}$, $105_{D2}$, and $105_{D3}$, the n-type high-concentration drain regions $108_{D1}$, $108_{D2}$, and $108_{D3}$, the on-source silicide films $105_{S1}$, $105_{S2}$, and $105_{S3}$, and the n-type high-concentration source regions $108_{S1}$, $108_{S2}$, and $108_{S3}$ are isolated from one another by the element isolation regions 102, respectively. The entire electrostatic discharge protected transistor can, therefore, prevent occurrence of local current concentration.

However, according to the conventional art, each of the transistors 121 to 123 is sub-divided into sub-transistors corresponding to the respective semiconductor moats. It is, therefore, necessary to provide regions for isolating diffused layers of the respective sub-transistors from one another within each of the transistors 121 to 123. This disadvantageously increases a total area of the electrostatic discharge protected transistor.

SUMMARY OF THE INVENTION

It is an object of the present invention to prevent local current concentration without increasing an area of an integrated circuit including salicide transistors.

According to one aspect of the present invention, there is provided a first semiconductor device, comprising: a semiconductor substrate which includes an active region; an element isolation region provided in a region surrounding sides of the active region of the semiconductor substrate; a gate insulating film provided on the active region; a gate electrode provided on the gate insulating film; a source region and a drain region which are provided in regions located below sides of the gate electrode in the active region, respectively; an on-source silicide film provided on the source region; an on-drain silicide film provided on the drain region; a plurality of source contacts which are provided over the source region with the on-source silicide film interposed therebetween, and which are aligned in a gate width direction; and a plurality of drain contacts which are provided over the drain region with the on-drain silicide film interposed therebetween, and which are aligned in the gate width direction, wherein the on-drain silicide film is provided to be divided into a plurality of on-drain silicide films and the resultant on-drain silicide films are isolated from one another in at least one region out of regions located between respective adjacent pairs of the drain contacts among the plurality of drain contacts.

By so constituting, the region in which the on-drain silicide films are not provided has a high resistance. Therefore, it is possible to prevent a current flowing between one drain contact and one source contact from flowing between the other drain contact and the other source contact for adjacent drain contacts. Thus, local current concentration can be prevented without causing an increase in the area of the semiconductor device.

It is preferable that the on-drain silicide film is provided to be divided into segments and the resultant divided on-drain silicide films are isolated to correspond to the drain contacts, respectively. If so, the on-drain silicide films are provided to be isolated from one another to correspond to the respective drain contacts, thereby making it possible to ensure preventing the current from flowing between the elements.

The on-source silicide film may be provided on an entire surface of the source region.

Needless to say, however, if the on-source silicide film is divided into a plurality of on-source silicide films and the resultant on-source silicide films are isolated from one another in at least one region out of regions located between respective adjacent pairs of the source contacts among the plurality of source contacts, it is possible to further ensure preventing the current concentration.

As a specific structure for isolating the on-drain silicide films from one another, there is a structure in which a protection film is provided on the drain region in at least one region out of regions put between the respective adjacent pairs of the drain contacts among the plurality of drain contacts, thereby providing the on-drain silicide films to be isolated from one another.

The gate electrode may be composed of a polysilicon film, and an on-gate silicide film may be formed on the gate electrode.

According to another aspect of the present invention, there is provided a second semiconductor device, comprising: a semiconductor substrate which includes an active region; an element isolation region provided in a region surrounding sides of the active region of the semiconductor substrate; a gate insulating film provided on the active region; a gate electrode provided on the gate insulating film; a source region and a drain region which are provided in regions located below sides of the gate electrode in the active region, respectively; an on-source silicide film provided on the source region; an on-drain silicide film provided on the drain region; a plurality of source contacts which are provided over the source region with the on-source silicide film interposed therebetween, and which are aligned in a gate width direction; and a plurality of drain contacts which are provided over the drain region with the on-drain silicide film interposed therebetween, and which are aligned in the gate width direction, wherein the on-drain silicide film includes a narrow-width silicide region in at least one region out of regions located between respective adjacent pairs of the drain contacts among the plurality of drain contacts, the narrow-width silicide region being smaller in a width in a gate length direction than respective regions where the drain contacts are formed.

By so constituting, the narrow-width silicide film has a high resistance. Therefore, it is possible to prevent a current flowing between the drain contact and the source contact of one element from flowing between the drain contact and the source contact of the other element. Thus, local current concentration can be prevented without causing an increase in the area of the semiconductor device.

It is preferable that the narrow-width silicide region is provided in each of the regions located between the respective adjacent pairs of the drain contacts among the plurality of drain contacts. If so, on-drain silicide films are provided to be isolated from one another to correspond to respective elements. It is, therefore, possible to ensure preventing a current from flowing between the elements.

As a specific structure for providing the narrow-width silicide film, there is a structure in which a dummy gate insulating film and a dummy gate electrode located on the dummy gate insulating film are provided on the at least one region out of the regions located between the respective adjacent pairs of the drain contacts among the plurality of drain contacts, and in which the narrow-width silicide region is provided on the drain region located between the dummy gate electrode and the gate electrode. With this structure, the dummy gate insulating film and the dummy gate electrode can be formed to have a smaller plane area than that of the conventional element isolation region. It is, therefore, possible to prevent an increase in the area of the semiconductor device. Further, since the gat electrode and the gate capacitance are provided to be isolated from each other, the gate capacitance is not increased.

As another specific structure for providing the narrow-width silicide film, there is a structure in which a protection film is provided on the at least one region out of the regions located between the respective adjacent pairs of the drain contacts among the plurality of drain contacts on the train region, and in which the narrow-width silicide region is provided on the drain region located between the protection film and the gate electrode. With this structure, the on-drain silicide film on the adjacent drain regions can be set to have a high resistance without isolating the adjacent drain regions from each other. Therefore, it is possible to secure the drain region that functions as the active region, and thereby prevent an increase in the area of the semiconductor device.

A width of the drain region in the gate length direction in the at least one region in which the narrow-width silicide region is formed may be equal to a width of the drain region in the gate length direction in the regions in which the drain contacts are formed.

Further, in the second semiconductor device according to the present invention, similarly to the first semiconductor device, the on-source silicide film may include a narrow-width silicide region in at least one region out of regions located between respective adjacent pairs of the source contacts among the plurality of source contacts, the narrow-width silicide region being smaller in a width in a gate length direction than respective regions where the source contacts are formed. If so, it is possible to further ensure preventing the current concentration.

As a specific structure for providing the source-side narrow-width silicide region, there is a structure in which a dummy gate insulating film and a dummy gate electrode located on the dummy gate insulating film are provided on the at least one region out of the regions located between the respective adjacent pairs of the source contacts among the plurality of source contacts on the source region, and in which the source-side narrow-width silicide film is provided on the source region located between the dummy gate electrode and the gate electrode.

As another specific structure for providing the source-side narrow-width silicide film, there is a structure in which a source-side protection film is provided on the at least one region out of the regions located between the respective adjacent pairs of the source contacts among the plurality of source contacts on the source region, and in which the source-side narrow-width silicide region is provided on the source region located between the source-side protection film and the gate electrode.

A width of the source region in the gate length direction in the at least one region in which the source-side narrow-width silicide region is formed may be equal to a width of the source region in the gate length direction in the regions in which the source contacts are formed.

BRIEF DESCRIPTION OF THE DRAWINGS

FIGS. 2A to 2C are sections which depict the electrostatic discharge protected transistor according to the first embodiment of the present invention, wherein FIG. 2A is a section taken along a line A1—A1 of FIG. 1, FIG. 2B is a section taken along a line B1—B1 of FIG. 1, and FIG. 2C is a section taken along a line C1—C1 of FIG. 1.

FIGS. 5A to 5C are sections which depict the electrostatic discharge protected transistor according to the second embodiment of the present invention, wherein FIG. 5A is a section taken along a line A2—A2 of FIG. 4, FIG. 5B is a section taken along a line B2—B2 of FIG. 4, and FIG. 5C is a section taken along a line C2—C2 of FIG. 4.

FIGS. 8A to 8C are sections which depict the electrostatic discharge protected transistor according to the first embodiment of the present invention, wherein FIG. 8A is a section taken along a line A3—A3 of FIG. 7, FIG. 8B is a section taken along a line B3—B3 of FIG. 7, and FIG. 8C is a section taken along a line C3—C3 of FIG. 7.

FIGS. 11A to 11C are sections which depict the conventional electrostatic discharge protected transistor, wherein FIG. 11A is a section taken along a line A4—A4 of FIG. 10, FIG. 11B is a section taken along a line B4—B4 of FIG. 10, and FIG. 11C is a section taken along a line C4—C4 of FIG. 10.

DETAILED DESCRIPTION OF THE INVENTION

Figure 1:
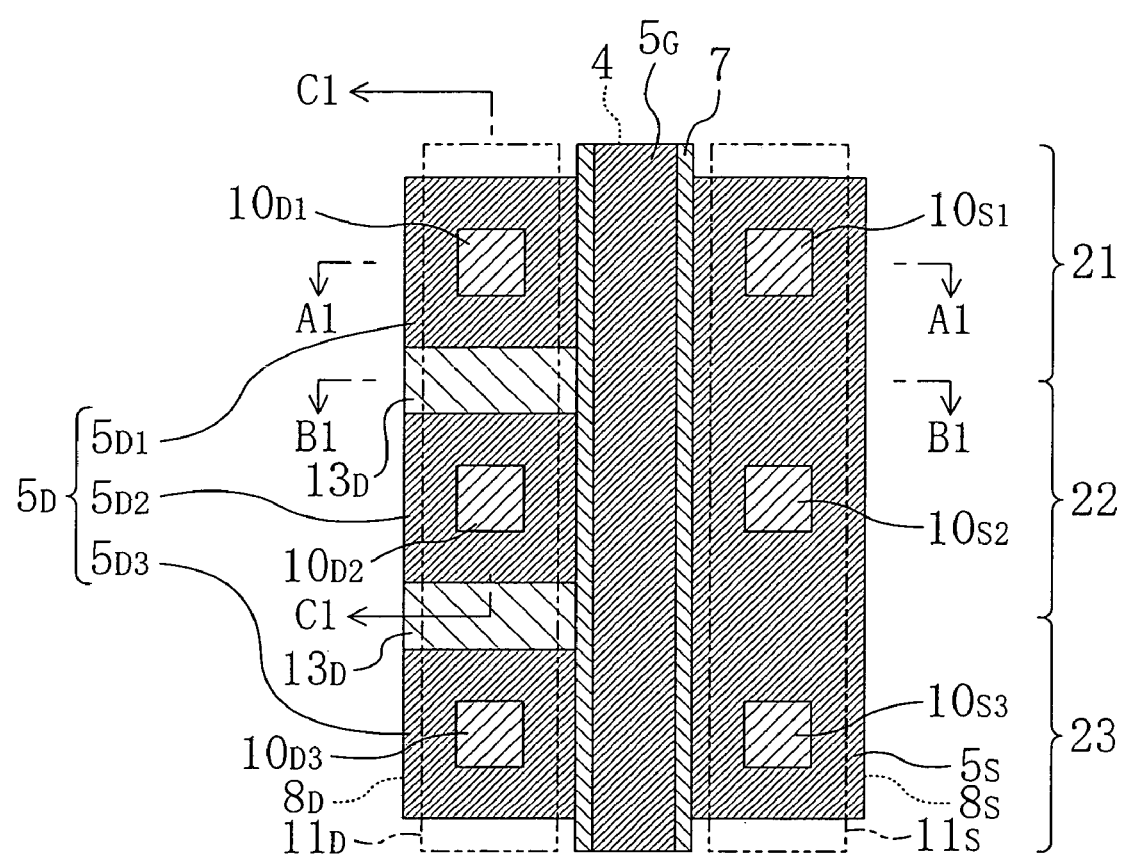
FIG. 1 is a plan view which depicts an electrostatic discharge protected transistor according to a first embodiment of the present invention.

Hereinafter, preferred embodiments of the present invention will be described with reference to the accompanying drawings, in which the same reference numerals denote the same components, respectively.

First Embodiment

A structure of an electrostatic discharge protected transistor according to a first embodiment of the present invention will be described with reference to FIG. 1 and FIGS. 2A to 2C.

Figure 2A:
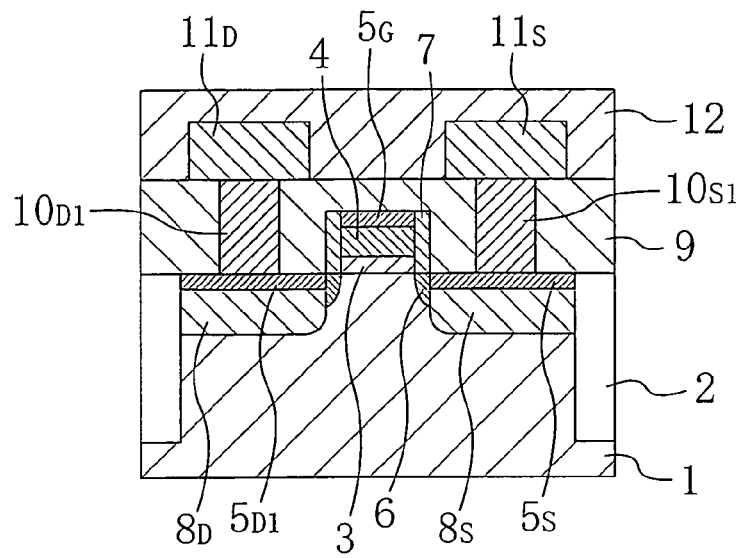
Figure 2B:
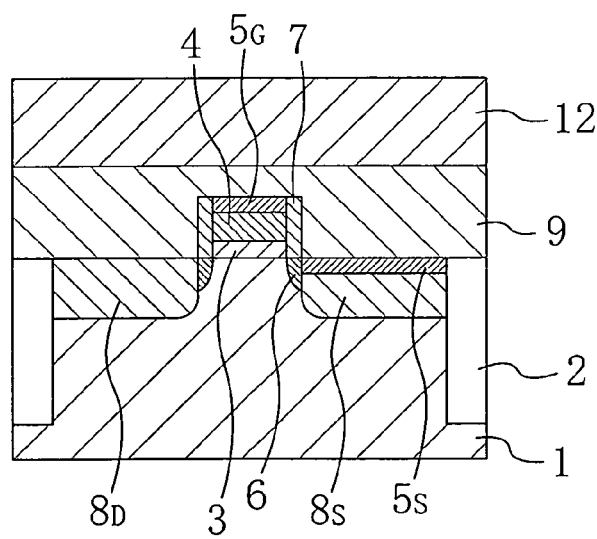
Figure 2C:
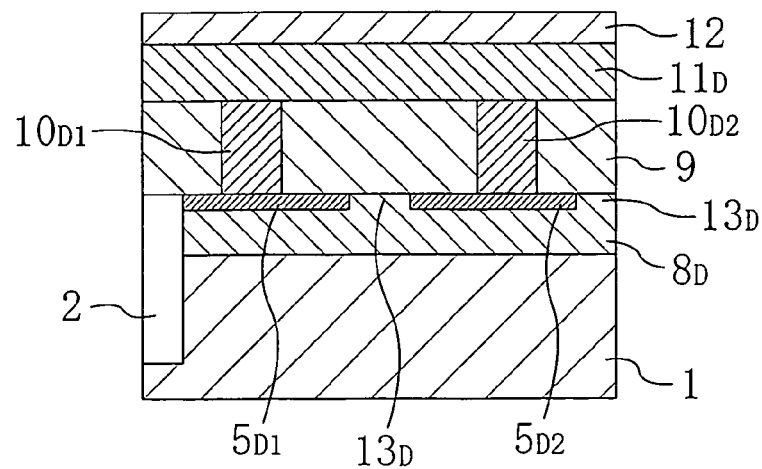

FIG. 1 is a plan view which depicts an electrostatic discharge protected transistor according to the first embodiment of the present invention. FIGS. 2A to 2C are sections which depict the electrostatic discharge protected transistor according to the first embodiment of the present invention. Specifically, FIG. 2A is a section taken along a line A1—A1 of FIG. 1, FIG. 2B is a section taken along a line B1—B1 of FIG. 1, and FIG. 2C is a section taken along a line C1—C1 of FIG. 1.

As shown in FIG. 1, the electrostatic discharge protected transistor according to the first embodiment is constituted so that a plurality of transistors, i.e., transistors 21, 22, and 23 are arranged to share a common electrode 4 among them.

As shown in FIG. 2A, each of the transistors 21 to 23 includes an element isolation region 2 of an STI structure which has an insulating film buried in a trench provided in a p-type semiconductor substrate 1 that consists of silicon, a gate insulating film 3 which is provided on an active region of the p-type semiconductor substrate 1 and which is composed of a silicon oxide film, a gate electrode 4 which is provided on the gate insulating film 3 and which is composed of a doped polysilicon film, and an on-gate silicide film $5_G$ which is formed on the gate electrode 4.

Each of the transistors 21 to 23 also includes n-type low-concentration diffused layers 6 which are formed in regions of the active region of the semiconductor substrate 1 which regions are located below respective sides of the gate electrode 4, insulating sidewall spacers 7 which are formed on respective side surfaces of the gate electrode 4, an n-type high-concentration drain region $8_D$ and an n-type high-concentration source region $8_S$ which are formed in regions of the active region of the semiconductor substrate 1 which regions are located below respective sides of the sidewalls 7, an on-drain silicide film $5_D$ ($5_{D1}$, $5_{D2}$, or $5_{D3}$) which is formed on the n-type high-concentration drain region $8_D$, and an on-source silicide film $5_S$ which is formed on the n-type high-concentration source region $8_S$. The on-gate silicide film $5_G$, the on-drain silicide film $5_D$, and the on-source silicide film $5_S$ are composed of cobalt silicide films, respectively, and are formed simultaneously by a salicide technique.

Further, each transistor includes an interlayer insulating film 9 formed on the semiconductor substrate 1, a drain contact $10_D$ ($10_{D1}$, $10_{D2}$, or $10_{D3}$) which penetrates the interlayer insulating film 9 on the n-type high-concentration drain region $8_D$ and which reaches the on-drain silicide film $5_D$, a source contact $10_S$ ($10_{S1}$, $10_{S2}$, or $10_{S3}$) which penetrates the interlayer insulating film 9 on the n-type high-concentration source region $8_S$ and which reaches the on-source silicide film $5_S$, metal wirings $11_D$ and $11_S$ which are formed on the interlayer insulating film 9 so as to be connected to the drain contact $10_D$ and the source contact $10_S$, respectively, and each of which consists of Al or Al alloy, and an interlayer insulating film 12 formed on the interlayer insulating film 9 and the metal wirings $11_D$ and $11_S$. The metal wirings $11_D$ and $11_S$ may be formed by a so-called single damascene method for forming each of the metal wirings $11_D$ and $11_S$ by forming a contact hole and a wiring groove in an interlayer insulating film and then burying a Cu film.

A first feature of the first embodiment is in that the element isolation region 2 is not provided in a region located on a boundary of each of the transistors 21 to 23, as shown in FIGS. 2B and 2C. Namely, the active regions of the transistors 21 to 23 are isolated from another region by the element isolation regions 2 but the transistors 21 to 23 are not isolated from one another.

A second feature of the first embodiment is in that the on-drain silicide films $5_{D1}$, $5_{D2}$, and $5_{D3}$ are provided on the n-type high-concentration drain region $8_D$ to be divided by regions $13_D$ to correspond to the respective transistors 21 to 23 as shown in FIG. 1 and FIGS. 2A to 2C. In addition, the on-source silicide film $5_S$ is formed on an entire surface of the n-type high-concentration source region $8_S$.

In this embodiment, since the on-drain silicide films $5_{D1}$, $5_{D2}$, and $5_{D3}$ are provided to correspond to the respective transistors 21 to 23 on the n-type high-concentration drain region $8_D$, a resistance of the region $13_D$ between the adjacent drain regions is high. This can prevent a current from flowing between the adjacent transistors, e.g., prevent a current flowing between the drain contact $10_{D1}$ and the source contact $10_{S1}$ from flowing between the drain contact $10_{D2}$ and the source contact $10_{S2}$. Accordingly, the transistors 21 to 23 are not isolated from one another by the element isolation regions 2, so that local current concentration can be prevented without increasing an area of the electrostatic discharge protected transistor. Since a drain region is higher in electric field than a source region, current concentration tends to occur to the drain region more frequently than the source region. For this reason, the on-drain silicide films $5_D$ ($5_{D1}$, $5_{D2}$, and $5_{D3}$) are formed for the respective transistors 21 to 23, and the common on-source silicide film 5S is provided to be shared among the transistors 21 to 23.

A method for manufacturing the semiconductor device according to this embodiment will next be described briefly.

First, the element isolation region 2, the gate insulating film 3, the gate electrode 4, and the n-type low-concentration diff-used layers 6 are formed using a well-known technique. An oxide film having a thickness of 50 nm for formation of a sidewall is then formed on the substrate 1, and n-type impurities such as arsenic (As) or phosphorus (P) are doped by ion implantation, thereby forming the n-type high-concentration drain region $8_D$ and the n-type high-concentration source region $8_S$.

Using photolithography and dry etching technique, the oxide film is selectively etched, thereby forming the sidewall spacers 7 on the respective side surfaces of the gate electrode 4. At the same time, a protection film (not shown) composed of an oxide film is formed on a part (each region $13_D$) on the high-concentration drain region $8_D$. This protection film is formed in a region between the adjacent drain contacts $10_D$, to be formed at a later step, so as to cross the n-type high-concentration drain region $8_D$ in a gate length direction.

After forming a cobalt film on the entire surface of the substrate 1, a first heat treatment is performed for siliciding the cobalt film, thereby forming the on-gate silicide film $5_G$ on the gate electrode 4, the on-drain silicide films $5_D$ ($5_{D1}$, $5_{D2}$, and $5_{D3}$) on the n-type high-concentration drain region $8_D$, and the on-source silicide film $5_S$ on the n-type high-concentration source region $8_S$. At this time, the cobalt silicide film is not formed on the protection film formed on the region $13_D$ in the n-type high-concentration drain region $8_D$. Therefore, the on-drain silicide film $5_D$ is formed to be divided to the three on-drain silicide films $5_{D1}$, $5_{D2}$, and $5_{D3}$.

After selectively removing the unreacted cobalt film, a second heat treatment is performed to thereby stabilize structures of the silicide films $5_G$, $5_S$, and $5_D$. The protection film is then removed.

After forming the interlayer insulating film 9 on the substrate 1, a plurality of contact holes are formed in the interlayer insulating film 9, and a conductive material is buried into each contact hole, thereby forming the drain contact $10_{D1}$, $10_{D2}$, $10_{D3}$, and the source contacts $10_{S1}$, $10_{S2}$, and $10_{S3}$. Next, after forming the metal wirings $11_D$ and $11_S$ connected to the drain contacts $10_{D1}$, $10_{D2}$, and $10_{D3}$, and to the source contacts $10_{S1}$, $10_{S2}$, and $10_{S3}$ on the interlayer insulating film 9, respectively, the interlayer insulating film 12 is formed. The semiconductor device according to this embodiment can be thereby obtained.

Alternatively, the protection film for preventing the silicide film from being formed on the region $13_D$ may be left without removing it. If so, with the structure shown in FIGS. 1, 2B, and 2C, the protection film remains present between the n-type high-concentration drain region $8_D$ and the interlayer insulating film 9 in the region $13_D$ which is located on the n-type high-concentration drain region $8_D$ and on which the silicide film is not formed.

Modifications of First Embodiment

Figure 3:
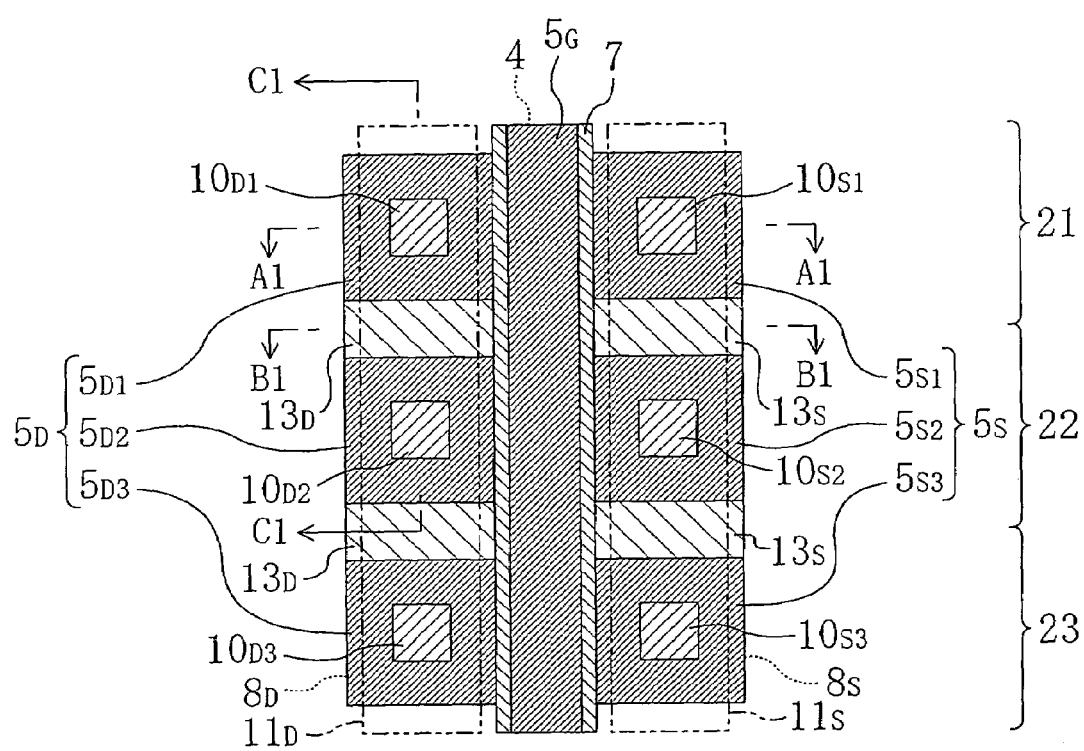
FIG. 3 is a plan view which depicts a modification of the electrostatic discharge protected transistor according to the first embodiment of the present invention.

A modification of the first embodiment will be described with reference to FIG. 3. FIG. 3 is a plan view which depicts a modification of the electrostatic discharge protected transistor according to the first embodiment of the present invention. In FIG. 3, the same reference numerals denote the same constituent elements as those in the first embodiment shown in FIG. 1.

In this modification, the on-source silicide film $5_S$ on the n-type concentration source region $8_S$ is divided to the three silicide films $5_{S1}$, $5_{S2}$, and $5_{S3}$ to correspond to the respective transistors 21 to 23. The other constituent elements are equal to those shown in FIG. 1.

In this modification, since the on-source silicide films $5_{S1}$, $5_{S2}$, and $5_{S3}$ are isolated from one another by the regions $13_S$, adjacent source contacts $10_{S1}$, $10_{S2}$, and $10_{S3}$ are not electrically connected to one another by the silicide film.

With this configuration, the same advantages as those of the first embodiment can be attained. In addition, since the on-source silicide films $5_{S1}$, $5_{S2}$, and $5_{S3}$ are isolated from one another to correspond to the respective elements, it is possible to further ensure preventing the local current concentration. Namely, since the regions $13_D$ between the respective pairs of the adjacent drains and the regions $13_S$ between the respective pairs of the adjacent sources have high resistances, it is possible to prevent a current from flowing between the adjacent transistors, e.g., prevent a current flowing between the drain contact $10_{D1}$ and the source contact $10_{S1}$ from flowing between the drain contact $10_{D2}$ and the source contact $10_{S2}$. As a consequence and because of the fact that the transistors 21 to 23 are not isolated from one another by the element isolation regions, it is possible to prevent the local current concentration without causing an increase in the area of the semiconductor device.

Second Embodiment

A structure of an electrostatic discharge protected transistor according to a second embodiment of the present invention will be described with reference to FIG. 4 and FIGS. 5A to 5C.

Figure 4:
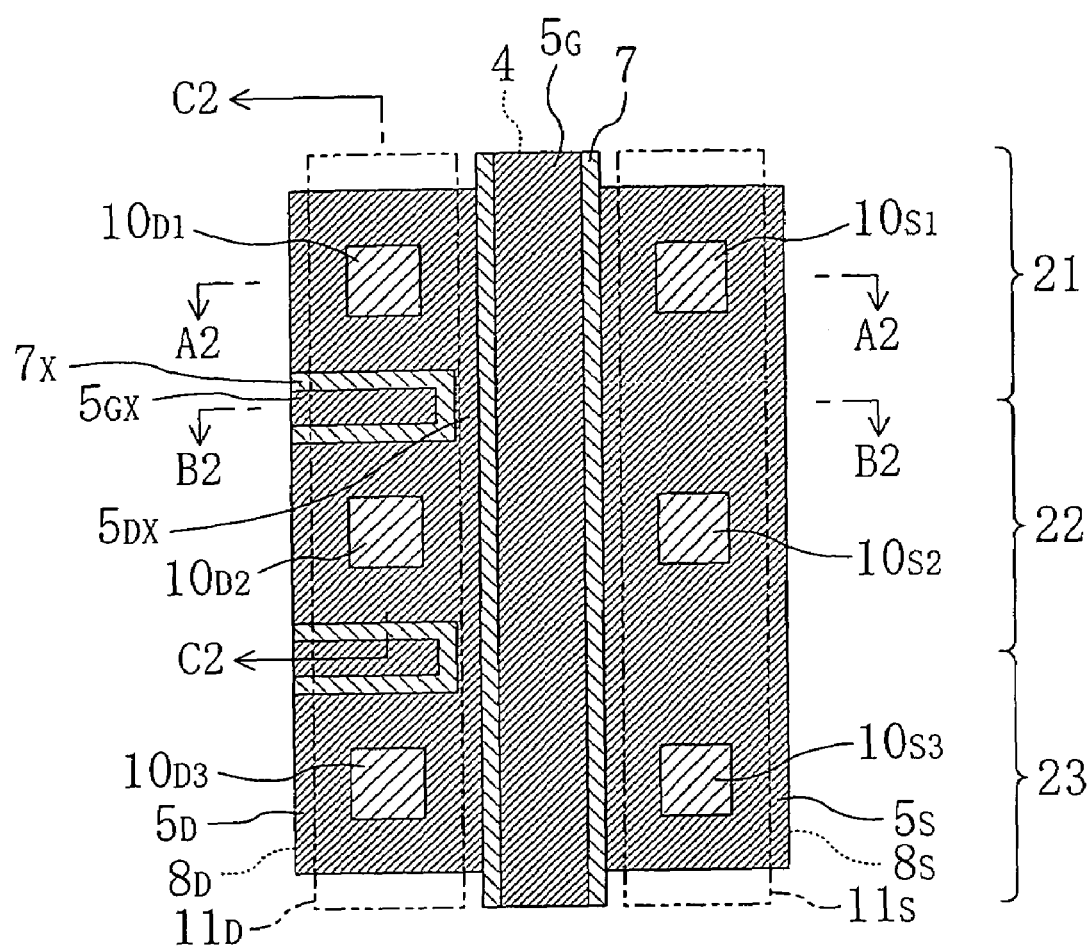
FIG. 4 is a plan view which depicts a electrostatic discharge protected transistor according to a second embodiment of the present invention.
Figure 5A:
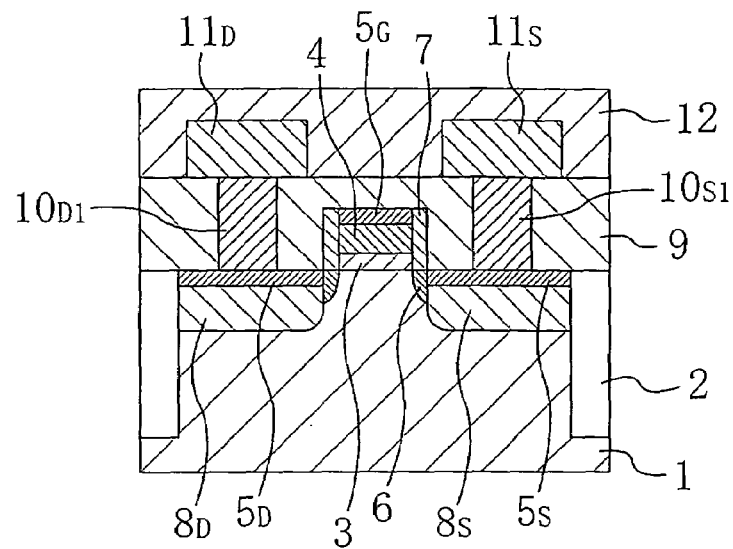
Figure 5B:
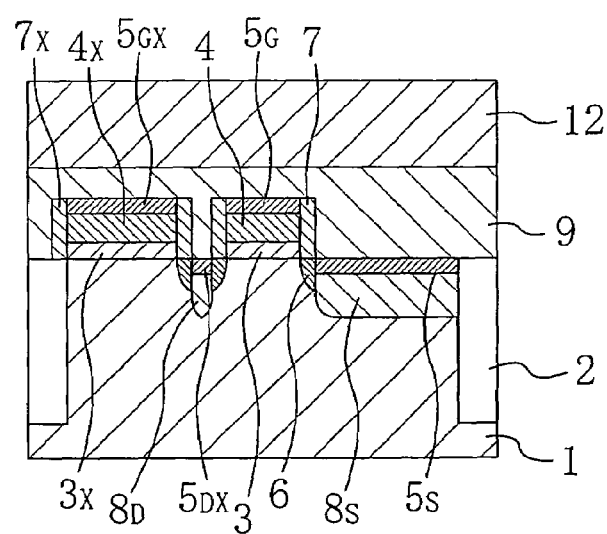
Figure 5C:
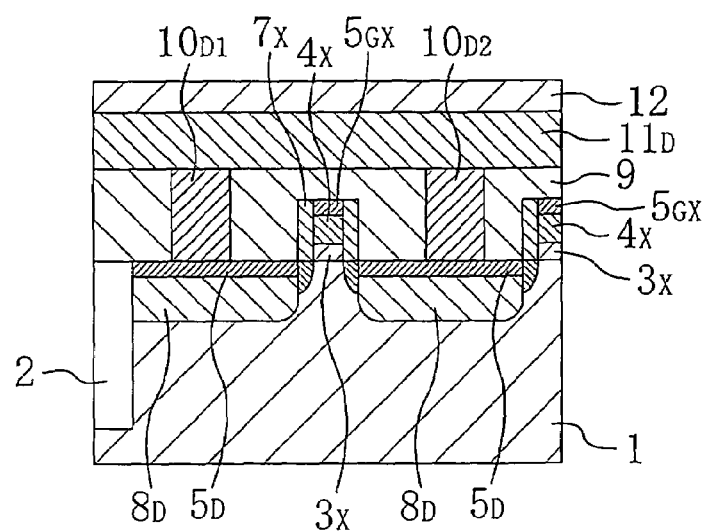

FIG. 4 is a plan view which depicts an electrostatic discharge protected transistor according to the second embodiment of the present invention. FIGS. 5A to 5C are sections which depict the electrostatic discharge protected transistor according to the second embodiment of the present invention. Specifically, FIG. 5A is a section taken along a line A2—A2 of FIG. 4, FIG. 5B is a section taken along a line B2—B2 of FIG. 1, and FIG. 5C is a section taken along a line C2—C2 of FIG. 5.

As shown in FIG. 4, the electrostatic discharge protected transistor according to the second embodiment is constituted so that a plurality of transistors, i.e., transistors 21, 22, and 23 are arranged to share a common electrode 4 among them.

As shown in FIG. 5A, each of the transistors 21 to 23 includes an element isolation region 2 of an STI structure which has an insulating film buried in a trench formed in a p-type semiconductor substrate 1 that consists of silicon, a gate insulating film 3 which is provided on an active region of the p-type semiconductor substrate 1 and which is composed of a silicon oxide film, a gate electrode 4 which is provided on the gate insulating film 3 and which is composed of a doped polysilicon film, and an on-gate silicide film $5_G$ which is provided on the gate electrode 4.

Each of the transistors 21 to 23 also includes n-type low-concentration diffused layers 6 which are formed in regions of the active region of the semiconductor substrate 1 which regions are located below respective sides of the gate electrode 4, insulating sidewall spacers 7 which are formed on respective side surfaces of the gate electrode 4, an n-type high-concentration drain region $8_D$ and an n-type high-concentration source region $8_S$ which are formed in regions of the active region of the semiconductor substrate 1 which regions are located below respective sides of the sidewalls 7, an on-drain silicide film $5_D$ which is formed on the n-type high-concentration drain region $8_D$, and an on-source silicide film $5_S$ which is formed on the n-type high-concentration source region $8_S$. The on-gate silicide film $5_G$, the on-drain silicide film $5_D$, and the on-source silicide film $5_S$ are composed of cobalt silicide films, respectively, and are formed simultaneously by a salicide technique.

Further, each transistor includes an interlayer insulating film 9 formed on the semiconductor substrate 1, a drain contact $10_D$ ($10_{D1}$, $10_{D2}$, or $10_{D3}$) which penetrates the interlayer insulating film 9 on the n-type high-concentration drain region $8_D$ and which reaches the on-drain silicide film $5_D$, a source contact $10_S$ ($10_{S1}$, $10_{S2}$, or $10_{S3}$) which penetrates the interlayer insulating film 9 on the n-type high-concentration source region $8_S$ and which reaches the on-source silicide film $5_S$, metal wirings $11_D$ and $11_S$ which are formed on the interlayer insulating film 9 so as to be connected to the drain contact $10_D$ and the source contact $10_S$, respectively, and each of which consists of Al or Al alloy, and an interlayer insulating film 12 formed on the interlayer insulating film 9 and the metal wirings $11_D$ and $11_S$. The metal wirings $11_D$ and $11_S$ may be formed by a so-called single damascene method for forming each of the metal wirings $11_D$ and $11_S$ by forming a contact hole and a wiring groove in an interlayer insulating film and then burying a Cu film.

A feature of the second embodiment is in that a dummy gate insulating film $3_X$, a dummy gate electrode $4_X$ located on the dummy gate insulating film $3_X$ and composed of a doped polysilicon film, an on-dummy-gate silicide film $5_{GX}$ located on the dummy gate electrode $4_X$, and dummy sidewall spacers $7_X$ located on side surfaces of the dummy gate electrode $4_X$ are provided on regions located between respective adjacent pairs of the drain contacts $10_{D1}$ to $10_{D3}$ in the n-type high-concentration drain region $8_D$, as shown in FIG. 4 and FIGS. 5B and 5C. The dummy gate insulating film $3_X$, the dummy gate electrode $4_X$, the on-dummy-gate silicide film $5_{GX}$, and the dummy sidewall spacers $7_X$ are formed simultaneously using the same materials as those for the corresponding gate insulating film 3, gate electrode 4, the on-gate silicide film $5_G$, and the sidewall spacers 7, respectively.

As shown in FIG. 4 and FIGS. 5A and 5B, the on-source silicide film $5_S$ is formed on an entire surface of the n-type high-concentration source region $8_S$, and a plurality of source contacts $10_{S1}$, $10_{S2}$, and $10_{S3}$ formed on the n-type high-concentration source region $8_S$ are electrically connected to one another by a low-resistance on-source silicide film $5_S$.

The dummy gate electrode $4_X$ is arranged to be isolated from the gate electrode 4. By providing the dummy gate electrode $4_X$, a width of an on-drain silicide film $5_{DX}$ between the dummy gate electrode $4_X$ and the gate electrode 4 is smaller than that of the on-drain silicide film $5_D$ in other portions thereof. If the width of the silicide film is smaller, a sheet resistance is higher. Due to this, the on-drain silicide film $5_{DX}$ does not function as a low-resistance layer. If a cobalt silicide film is formed, for example, and if the width of the on-drain silicide film $5_{DX}$ in the gate length direction is as small as 0.1 µm or less, the sheet resistance is conspicuously increased.

Thus, the region between the drain contacts $10_{D1}$ and $10_{D2}$ and that between the drain contacts $10_{D2}$ and $10_{D3}$ are constituted to be connected to each other by the high-resistance on-drain silicide film $5_{DX}$. Therefore, it is possible to prevent a current from flowing between the adjacent transistors, e.g., prevent a current flowing between the drain contact $10_{D1}$ and the source contact $10_{S1}$ from flowing between the drain contact $10_{D2}$ and the source contact $10_{S2}$. It is thus possible to prevent local current concentration. It is noted that the semiconductor device can be formed to have a smaller plane area when the dummy gate electrode $4_X$ as described in this embodiment is provided than that when the element isolation is employed as described in the section of BACKGROUND OF THE INVENTION. Therefore, it is possible to more greatly prevent an increase in the area of the semiconductor according to this embodiment. Further, this embodiment has the following advantage. Since the gate electrode 4 is isolated from the dummy gate electrode $4_X$, a gate capacitance is not increased.

The sidewall spacers 7 and $7_X$ are formed on the side surfaces of the gate electrode 4 and the dummy gate electrode $4_X$, respectively. Therefore, by setting a distance between the gate electrode 4 and the dummy gate electrode $4_X$ to be more than double the width of each of the sidewall spacers 7 and $7_X$, the silicide film can be formed between the gate electrode 4 and the dummy gate electrode $4_X$.

A method for manufacturing the semiconductor device according to this embodiment will next be described briefly.

First, the element isolation region 2 is formed by removing a part of the semiconductor substrate 1 and burying an insulating film. The gate insulating film 3 and the gate electrode 4 are then formed on the active region of the semiconductor substrate 1. At the same time, the dummy gate insulating film $3_X$ and the dummy gate electrode $4_X$ are formed n a drain formation region. At this moment, the dummy gate insulating film $3_X$ and the dummy gate electrode $4_X$ are formed on the regions located between the respective adjacent pairs of the drain contacts $10_{D1}$ to $10_{D3}$ (shown in FIG. 4) so as to be distanced from the gate electrode 4. Thereafter, n-type impurities are doped by ion implantation while using the gate electrode 4 and the dummy electrode $4_X$ as a mask, thereby forming the n-type low-concentration diffused layer 6.

An oxide film having a thickness of 50 nm for formation of a sidewall is formed on the substrate 1, and the oxide film is then subjected to dry etching, thereby forming the sidewall spacers 7 and $7_X$ on the respective side surfaces of the gate electrode 4 and the dummy gate electrode $4_X$. Thereafter, n-type impurities are doped by ion implantation while using the gate electrode 4, the dummy gate electrode $4_X$, and the sidewall spacers 7 and $7_X$ as a mask, thereby forming the n-type high-concentration drain region $8_D$ and the n-type high-concentration source region $8_S$.

After forming a cobalt film on the entire surface of the substrate 1, a first heat treatment is performed for siliciding the cobalt film, thereby forming the on-gate silicide film $5_G$ on the gate electrode 4, the on-dummy-gate silicide film $5_{GX}$ on the dummy gate electrode $4_X$, the on-drain silicide film $5_D$ on the n-type high-concentration drain region $8_D$, and the on-source silicide film $5_S$ on the n-type high-concentration source region $8_S$.

At this time, in the region located between the dummy gate electrode $4_X$ and the gate electrode 4 in the n-type high-concentration drain region $8_D$, the high-resistance on-drain silicide film $5_{DX}$ smaller in the width in the gate length direction than that of the on-drain silicide film 5 in other portions thereof is formed. After selectively removing the unreacted cobalt film, a second heat treatment is performed to thereby stabilize structures of the respective silicide films $5_G$, $5_{GX}$, $5_S$, and $5_D$. Thereafter, the interlayer insulating film 9 is formed on the substrate 1, a plurality of contact holes are formed in the interlayer insulating film 9, and a conductive material is buried into each contact hole, thereby forming the drain contact $10_{D1}$, $10_{D2}$, $10_{D3}$, and the source contacts $10_{S1}$, $10_{S2}$, and $10_{S3}$ (shown in FIG. 4). Next, after forming the metal wirings $11_D$ and $11_S$ connected to the drain contacts $10_{D1}$, $10_{D2}$, and $10_{D3}$, and to the source contacts $10_{S1}$, $10_{S2}$, and $10_{S3}$ on the interlayer insulating film 9, respectively, the interlayer insulating film 12 is formed. The semiconductor device according to this embodiment can be thereby obtained.

Modification of Second Embodiment

Figure 6:
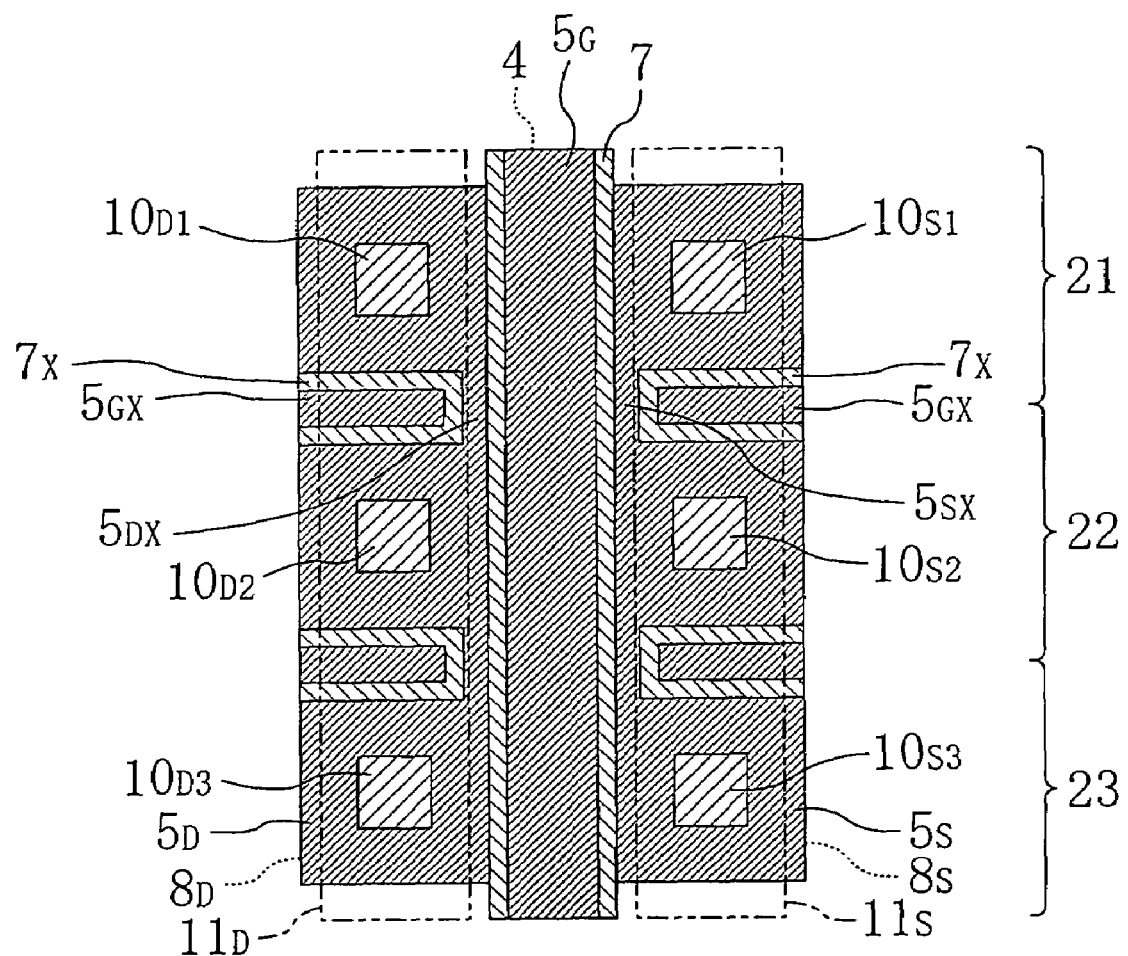
FIG. 6 is a plan view which depicts a modification of the electrostatic discharge protected transistor according to the second embodiment of the present invention.

A modification of the second embodiment will be described with reference to FIG. 6. FIG. 6 is a plan view which depicts a modification of the electrostatic discharge protected transistor according to the second embodiment of the present invention. In FIG. 6, the same reference numerals denote the same constituent elements as those in the second embodiment shown in FIG. 4.

In this modification, a dummy gate insulating film (not shown), a dummy gate electrode (not shown), the on-dummy-gate silicide film $5_{GX}$, and the dummy sidewall spacers $7_X$ are provided also on the n-type high-concentration source region $8_S$. Namely, the dummy gate insulating film, the dummy gate electrode formed on the dummy gate insulating film, the on-dummy-gate silicide film $5_{GX}$ formed on the dummy gate electrode, and the dummy sidewall spacers $7_X$ formed on side surfaces of the dummy gate electrode are provided on regions located between respective adjacent pairs of the source contacts $10_{S1}$ to $10_{S3}$ on the n-type high-concentration source region $8_S$. In addition, an on-source silicide film $5_{SX}$ smaller in width in the gate length direction than the on-source silicide film $5_{SX}$ in other regions is formed in portions located between the dummy gate electrode $4_X$ and the gate electrode 4 on the n-type high-concentration source region $8_S$. The other constituent elements are equal to those shown in FIG. 4.

With this configuration, the same advantages as those of the second embodiment can be attained. In addition, since the small-width and high-resistance on-source silicide film $5_{sx}$ is provided between the respective pairs of the transistors 21 to 23, it is possible to further ensure preventing the local current concentration. Namely, since the regions between the respective pairs of the adjacent drains and the regions between the respective pairs of the adjacent sources have high resistances, it is possible to prevent a current from flowing between the adjacent transistors, i.e., prevent a current flowing between the drain contact $10_{D1}$ and the source contact $10_S$, from flowing between the drain contact $10_{D2}$ and the source contact $10_{S2}$. As a consequence and because of the fact that the transistors 21 to 23 are not isolated from one another by the element isolation regions, it is possible to prevent the local current concentration without causing an increase in the area of the semiconductor device.

Third Embodiment

A structure of an electrostatic discharge protected transistor according to a third embodiment of the present invention will be described with reference to FIG. 7 and FIGS. 8A to 8C.

Figure 7:
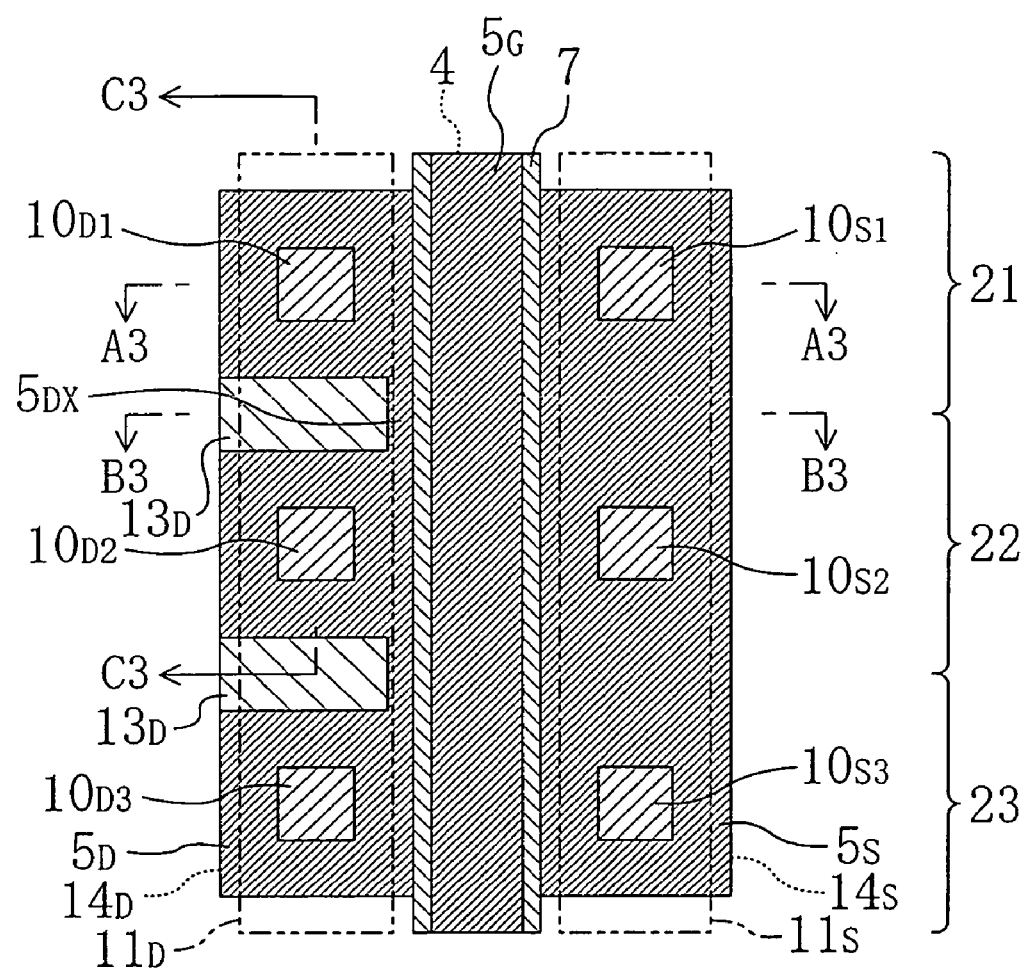
FIG. 7 is a plan view which depicts an electrostatic discharge protected transistor according to a third embodiment of the present invention.
Figure 8A:
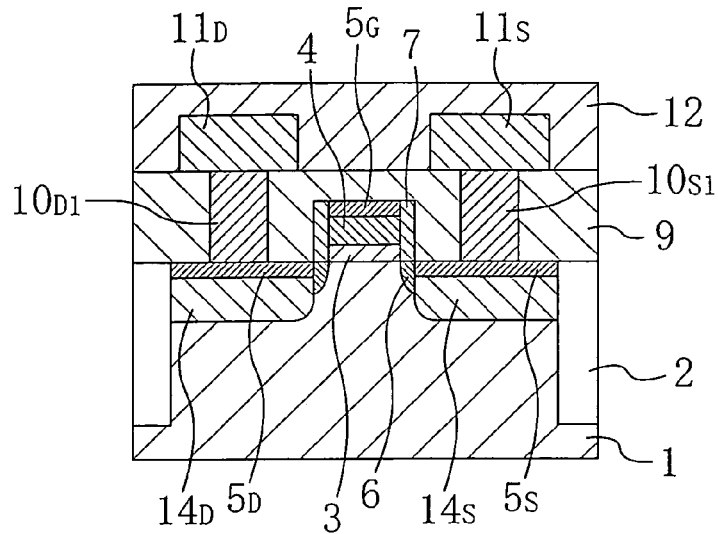
Figure 8B:
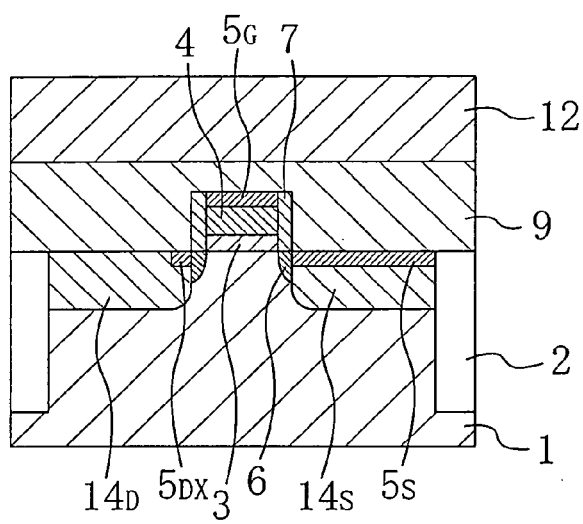
Figure 8C:
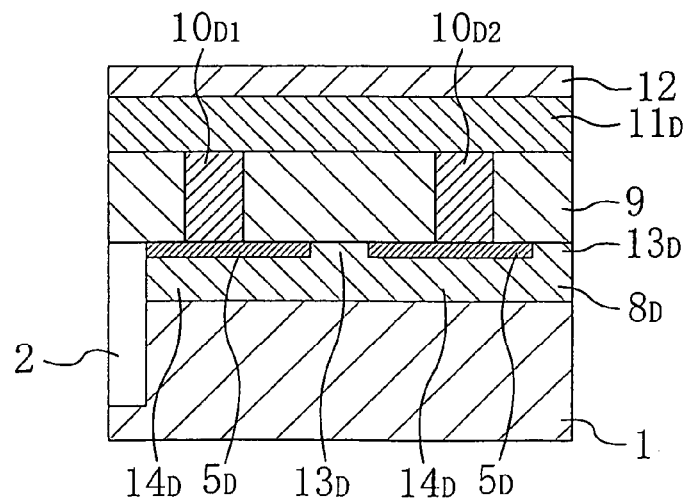

FIG. 7 is a plan view which depicts an electrostatic discharge protected transistor according to the third embodiment of the present invention. FIGS. 8A to 8C are sections which depict the electrostatic discharge protected transistor according to the third embodiment of the present invention. Specifically, FIG. 8A is a section taken along a line A3—A3 of FIG. 7, FIG. 8B is a section taken along a line B3—B3 of FIG. 7, and FIG. 8C is a section taken along a line C3—C3 of FIG. 7.

As shown in FIG. 7, the electrostatic discharge protected transistor according to the third embodiment is constituted so that that a plurality of transistors, i.e., transistors 21, 22, and 23 are arranged to share a common electrode 4 among them.

As shown in FIG. 8A, each of the transistors 21 to 23 includes an element isolation region 2 of an STI structure which has an insulating film buried in a trench provided in a p-type semiconductor substrate 1 that consists of silicon, a gate insulating film 3 which is provided on an active region of the p-type semiconductor substrate 1 and which is composed of a silicon oxide film, a gate electrode 4 which is provided on the gate insulating film 3 and which is composed of a doped polysilicon film, and an on-gate silicide film $5_G$ which is formed on the gate electrode 4.

Each of the transistors 21 to 23 also includes n-type low-concentration diffused layers 6 which are formed in regions of the active region of the semiconductor substrate 1 which regions are located below respective sides of the gate electrode 4, insulating sidewall spacers 7 which are formed on respective side surfaces of the gate electrode 4, an n-type high-concentration drain region $14_D$ and an n-type high-concentration source region $14_S$ which are formed in regions of the active region of the semiconductor substrate 1 which regions are located below respective sides of the sidewall spacers 7, an on-drain silicide film $5_D$ which is formed on the n-type high-concentration drain region $14_D$, and an on-source silicide film $5_S$ which is formed on the n-type high-concentration source region $14_S$. The on-gate silicide film $5_G$, the on-drain silicide film $5_D$, and the on-source silicide film $5_S$ are composed of cobalt silicide films, respectively, and are formed simultaneously by a salicide technique.

Further, each transistor includes an interlayer insulating film 9 formed on the semiconductor substrate 1, a drain contact $10_D$ ($10_{D1}$, $10_{D2}$, or $10_{D3}$) which penetrates the interlayer insulating film 9 on the n-type high-concentration drain region $14_D$ and which reaches the on-drain silicide film $5_D$, a source contact $10_S$ ($10_{S1}$, $10_{S2}$, or $10_{S3}$) which penetrates the interlayer insulating film 9 on the n-type high-concentration source region $14_S$ and which reaches the on-source silicide film $5_S$, metal wirings $11_D$ and $11_S$ which are formed on the interlayer insulating film 9 so as to be connected to the drain contact $10_D$ and the source contact $10_S$, respectively, and each of which consists of Al or Al alloy, and an interlayer insulating film 12 formed on the interlayer insulating film 9 and the metal wirings $11_D$ and $11_S$. The metal wirings $11_D$ and $11_S$ may be formed by a so-called single damascene method for forming each of the metal wirings $11_D$ and $11_S$ by forming a contact hole and a wiring groove in an interlayer insulating film and then burying a Cu film.

A first feature of the third embodiment is in that the element isolation region 2 is not provided in a region located on a boundary of each of the transistors 21 to 23, as shown in FIGS. 8B and 8C. Namely, the active regions of the transistors 21 to 23 are isolated from another region by the element isolation regions 2 but the transistors 21 to 23 are not isolated from one another.

A second feature of the third embodiment is in that regions $13_D$ in which the silicide film is not formed are provided in part of regions located between respective pairs of the drain contacts $10_{D1}$ to $10_{D3}$ in the n-type high-concentration drain region $14_D$, as shown in FIG. 7 and FIG. 8B. In addition, the on-source silicide film $5_S$ is formed on an entire surface of the n-type high-concentration source region $14_S$.

In this embodiment, a width of an on-drain silicide film $5_{DX}$ located between the respective pairs of the drain contacts $10_{D1}$ to $10_{D3}$ out of the on-drain silicide film $5_D$ is smaller in a gate length direction than a width of the on-drain silicide film $5_D$ in other regions thereof. If the width of the silicide film is smaller, a sheet resistance is higher. Due to this, the on-drain silicide film $5_{DX}$ does not function as a low-resistance layer. Thus, the region between the drain contacts $10_{D1}$ and $10_{D2}$ and that between the drain contacts $10_{D2}$ and $10_{D3}$ are constituted to be connected to each other by the high-resistance on-drain silicide film $5_{DX}$. Therefore, it is possible to prevent a current from flowing between the adjacent transistors, e.g., prevent a current flowing between the drain contact $10_{D1}$ and the source contact $10_{S1}$ from flowing between the drain contact $10_{D2}$ and the source contact $10_{S2}$. As a consequence and because of the fact that the transistors 21 to 23 are not isolated from one another by the element isolation regions 2, it is possible to prevent the local current concentration without causing an increase in the area of the semiconductor device. Since a drain region is higher in electric field than a source region, current concentration tends to occur to the drain region more frequently than the source region. For this reason, the on-drain silicide films $5_{DX}$ having the narrow width of the silicide film is formed only in the n-type high-concentration drain region $14_D$, and the on-source silicide film $5_S$ is formed on the entire surface of the n-type high-concentration source region $14_S$.

A method for manufacturing the semiconductor device according to this embodiment will next be described briefly.

First, the element isolation region 2, the gate insulating film 3, the gate electrode 4, and the n-type low-concentration diffused layers 6 are formed using a well-known technique. An oxide film having a thickness of 50 nm for formation of a sidewall is then formed on the substrate 1, and n-type impurities such as arsenic (As) or phosphorus (P) are doped by ion implantation, thereby forming the n-type high-concentration drain region $14_D$ and the n-type high-concentration source region $14_S$.

Using photolithography and dry etching technique, the oxide film is selectively etched, thereby forming the sidewall spacers 7 on the respective side surfaces of the gate electrode 4. At the same time, a protection film (not shown) composed of an oxide film is formed on a part (each region $13_D$) on the high-concentration drain region $14_D$ between the respective pairs of adjacent drain contacts formed at a later step. In this embodiment, the protection film is formed to be spaced apart from the sidewall spacers 7 formed on the respective side surfaces of the gate electrode 7.

After forming a cobalt film on the entire surface of the substrate 1, a first heat treatment is performed for siliciding the cobalt film, thereby forming the on-gate silicide film $5_G$ on the gate electrode 4, the on-drain silicide film $5_D$ on the n-type high-concentration drain region $14_D$, and the on-source silicide film $5_S$ on the n-type high-concentration source region $14_S$. At this time, the cobalt silicide film is not formed on the protection film formed on the region $13_D$. Therefore, the high-resistance on-drain silicide film $5_{DX}$ smaller in width in the gate length direction than the on-drain silicide film $5_D$ in other regions is formed in the region located between the region $13_D$ and the gate electrode 14 on the n-type high-concentration drain region $14_D$.

After selectively removing the unreacted cobalt film, a second heat treatment is performed to thereby stabilize structures of the silicide films $5_G$, $5_S$, and $5_D$. The protection film is then removed.

After forming the interlayer insulating film 9 on the substrate 1, a plurality of contact holes are formed in the interlayer insulating film 9, and a conductive material is buried into each contact hole, thereby forming the drain contact $10_{D1}$, $10_{D2}$, $10_{D3}$, and the source contacts $10_{S1}$, $10_{S2}$, and $10_{S3}$. Next, after forming the metal wirings $11_D$ and $11_S$ connected to the drain contacts $10_{D1}$, $10_{D2}$, and $10_{D3}$, and to the source contacts $10_{S1}$, $10_{S2}$, and $10_{S3}$ on the interlayer insulating film 9, respectively, the interlayer insulating film 12 is formed. The semiconductor device according to this embodiment can be thereby obtained.

Alternatively, the protection film for preventing the silicide film from being formed on the region $13_D$ may be left without removing it. If so, with the structure shown in FIGS. 7, 8B, and 8C, the protection film remains present between the n-type high-concentration drain region $14_D$ and the interlayer insulating film 9 in the region $13_D$ which is located on the n-type high-concentration drain region $14_D$ and on which the silicide film is not formed.

Modification of Third Embodiment

Figure 9:
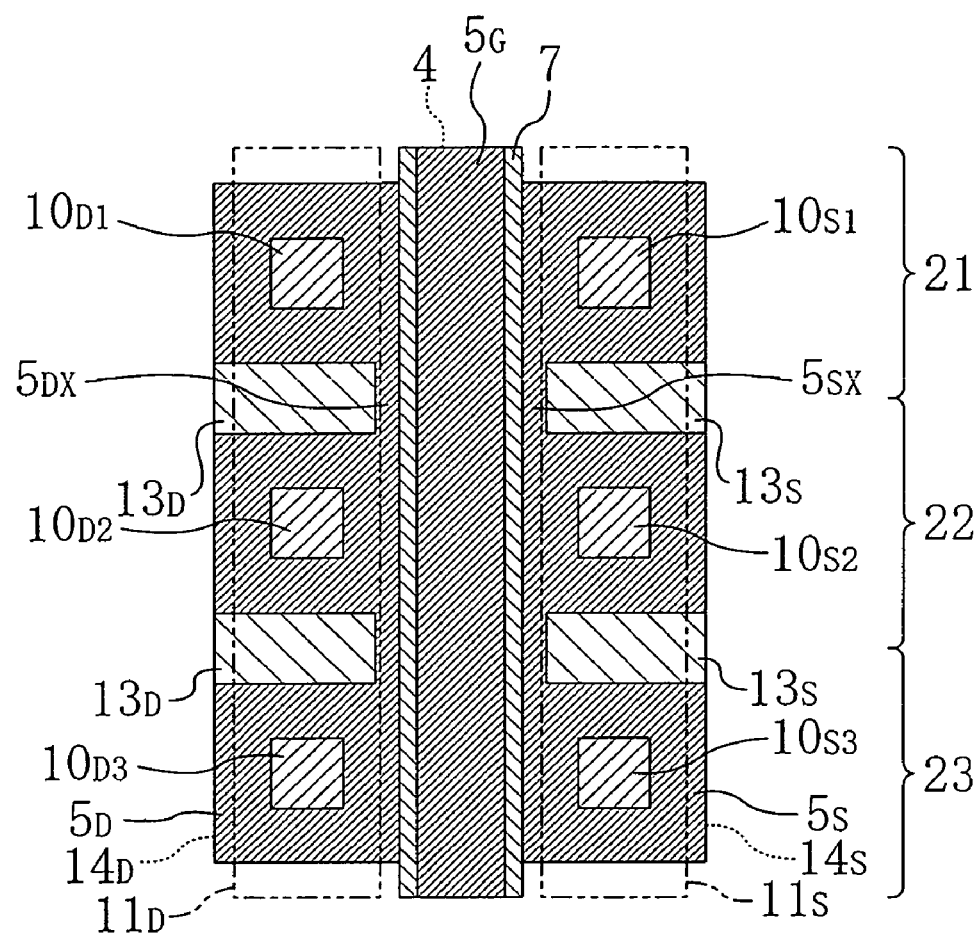
FIG. 9 is a plan view which depicts a modification of the electrostatic discharge protected transistor according to the second embodiment of the present invention.
Figure 10:
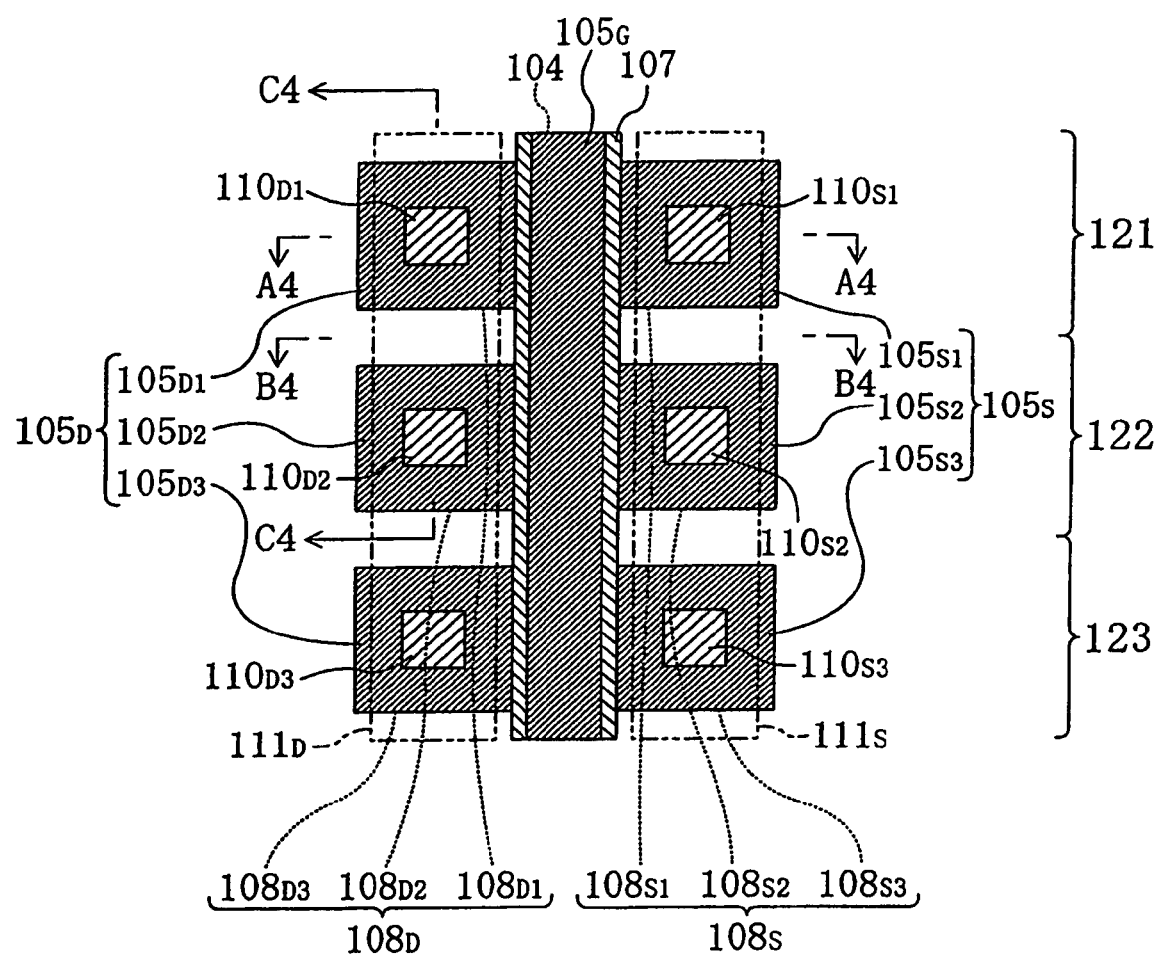
FIG. 10 is a plan view which depicts a conventional electrostatic discharge protected transistor including a silicide film.
Figure 11A:
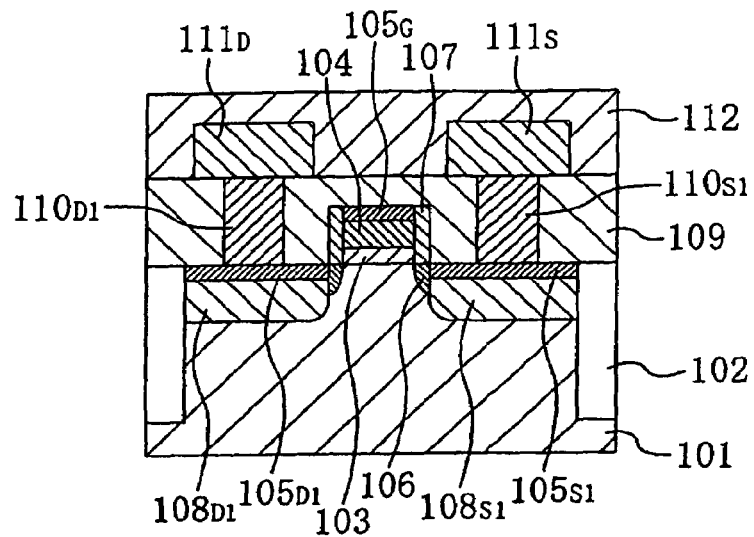
Figure 11B:
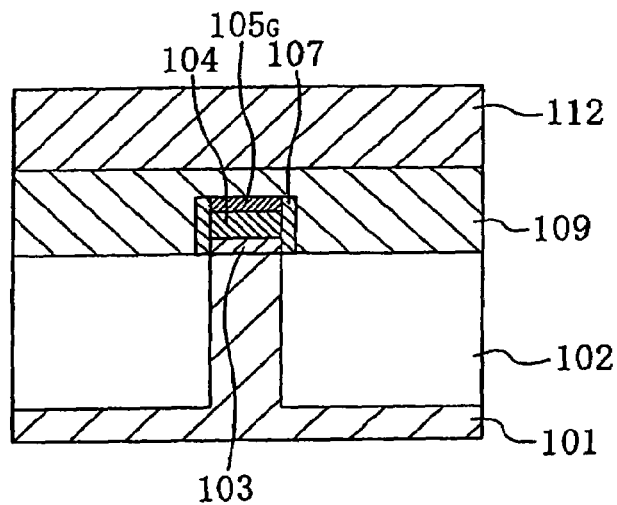
Figure 11C:
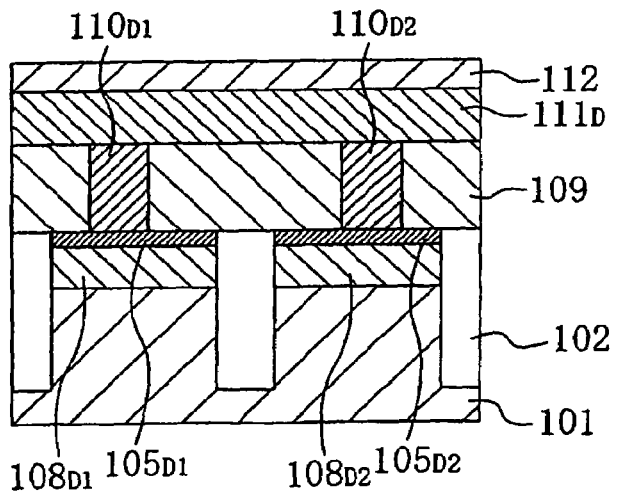

A modification of the third embodiment will be described with reference to FIG. 9. FIG. 9 is a plan view which depicts a modification of the electrostatic discharge protected transistor according to the third embodiment of the present invention. In FIG. 9, the same reference numerals denote the same constituent elements as those in the third embodiment shown in FIG. 7.

In this modification, regions $13_S$ in which the silicide film is not formed are provided in part of regions located between respective pairs of the source contacts $10_{S1}$ to $10_{S3}$ on the n-type high-concentration source region $14_S$. In addition, an on-source silicide film $5_{SX}$ smaller in width in the gate length direction than the on-source silicide film $5_{SX}$ in other regions is formed in portions located between the regions $13_S$ in which the silicide film is not formed and the sidewall spacers 7 formed on the side surfaces of the gate electrode 4 on the n-type high-concentration source region $14_S$. The other constituent elements are equal to those shown in FIG. 7.

With this configuration, the same advantages as those of the third embodiment can be attained. In addition, since the high-resistance and small-width on-source silicide film $5_{SX}$ is provided between the respective pairs of the transistors 21 to 23, it is possible to further ensure preventing the local current concentration. Namely, since the regions between the respective pairs of the adjacent drains and the regions between the respective pairs of the adjacent sources have high resistances, it is possible to prevent a current from flowing between the adjacent transistors, i.e., prevent a current flowing between the drain contact $10_{D1}$ and the source contact $10_{S1}$ from flowing between the drain contact $10_{D2}$ and the source contact $10_{S2}$. As a consequence and because of the fact that the transistors 21 to 23 are not isolated from one another by the element isolation regions, it is possible to prevent the local current concentration without causing an increase in the area of the semiconductor device.

In the embodiments and the modifications of the embodiments, the n channel transistors have been described. However, the present invention is similarly applicable to p channel transistors. If so, it is possible to prevent the local current concentration without causing an increase in the area.

What is claimed is:

1. A semiconductor device, comprising:
   a semiconductor substrate which includes an active region;
   an element isolation region provided in a region surrounding sides of said active region of said semiconductor substrate;
   a gate insulating film provided on said active region;
   a gate electrode provided on said gate insulating film;
   a source region and a drain region which are provided in regions located below sides of said gate electrode in said active region, respectively;
   an on-source silicide film provided on said source region;
   an on-drain silicide film provided on said drain region;
   a plurality of source contacts which are provided over said source region with said on-source silicide film interposed therebetween, and which are aligned in a gate width direction; and
   a plurality of drain contacts which are provided over said drain region with said on-drain silicide film interposed therebetween, and which are aligned in the gate width direction,
   wherein a first dummy gate insulating film and a first dummy gate electrode located on said first dummy gate insulating film are provided on the at least one region out of the regions located between the respective adjacent pairs of the drain contacts among said plurality of drain contacts in said active region located below sides of said gate electrode, and
   said on-drain silicide film includes a narrow-width silicide region in a region located between said first dummy gate electrode and said gate electrode, the narrow-width suicide region being smaller in a width in a gate length direction than respective regions where said drain contacts are formed.

2. The semiconductor device of claim 1,
   wherein said narrow-width silicide region is provided in each of the regions located between the respective adjacent pairs of the drain contacts among said plurality of drain contacts.

3. The semiconductor device of claim 1,
   wherein said on-source suicide film includes a narrow-width silicide region in at least one region out of regions located between respective adjacent pairs of the source contacts among said plurality of source contacts, the narrow-width silicide region being smaller in a width in a gate length direction than respective regions where said source contacts are formed.

4. The semiconductor device of claim 3,
   wherein a second dummy gate insulating film and a dummy gate electrode located on said second dummy gate insulating film are provided on the at least one region out of the regions located between the respective adjacent pairs of the source contacts among said plurality of source contacts on said source region, and
   said source-side narrow-width silicide region is provided on a part of said source region that is located between said second dummy gate electrode and said gate electrode.

5. The semiconductor device of claim 1, wherein said element isolation region has an STI structure which has an insulating film buried in a trench formed in said semiconductor substrate.

6. The semiconductor device of claim 1, wherein said gate electrode is composed of a doped polysilicon film.

7. The semiconductor device of claim 1, wherein an on-gate silicide film is provided on said gate electrode.

8. The semiconductor device of claim 1, wherein insulating sidewall spacers are formed on side surfaces of said gate electrode.

9. The semiconductor device of claim 8, wherein said on-drain suicide film is formed on regions which are located below respective sides of said sidewalls on said drain region.

10. The semiconductor device of claim 1, wherein regions located directly below said first dummy gate electrode in said active region have no drain region.

11. The semiconductor device of claim 1, wherein said first dummy gate insulating film and said first dummy gate electrode are formed using the same materials as those for said corresponding gate insulating film and gate electrode, respectively.

12. The semiconductor device of claim 1, wherein an on-dummy-gate-suicide film is formed on said first dummy gate electrode.

13. The semiconductor device of claim 1, wherein dummy sidewall spacers are formed on side surfaces of said first dummy gate electrode.

14. The semiconductor device of claim 1, wherein said first dummy gate electrode is arranged to be isolated from said gate electrode.

15. The semiconductor device of claim 1,
    wherein an insulating sidewall spacer is formed on each side surface of said gate electrode, a dummy sidewall spacer is formed on each side surface of said first dummy gate electrode, and said narrow-width suicide region is formed on a part of said drain region that is located between said sidewall spacer and said dummy sidewall spacer.

16. The semiconductor device of claim 1, wherein a width of said drain region in the gate length direction in a region in which said narrow-width suicide region is formed is smaller than a width of said drain region in the gate length direction in the regions in which said drain contacts are formed.

17. A semiconductor device, comprising:
a semiconductor substrate which includes an active region;
an element isolation region provided in a region surrounding sides of said active region of said semiconductor substrate;
a gate insulating film provided on said active region;
a gate electrode provided on said gate insulating film;
a source region and a drain region which are provided in regions located below sides of said gate electrode in said active region, respectively;
an on-source silicide film provided on said source region;
an on-drain silicide film provided on said drain region;
a plurality of source contacts which are provided over said source region with said on-source silicide film interposed therebetween, and which are aligned in a gate width direction; and
a plurality of drain contacts which are provided over said drain region with said on-drain silicide film interposed therebetween, and which are aligned in the gate width direction, wherein a dummy gate insulating film and a dummy gate electrode located on said dummy gate insulating film are provided on the at least one region out of the regions located between the respective adjacent pairs of the source contacts among said plurality of source contacts on said source region in said active region located below sides of said gate electrode, and said on-source silicide film includes a narrow-width silicide region in a region located between said dummy gate electrode and said gate electrode, the narrow-width silicide region being smaller in a width in a gate length direction than respective regions where said source contacts are formed.

18. The semiconductor device of claim 17, wherein said on-drain silicide film includes a narrow-width silicide region in the at least one region out of the regions located between the respective adjacent pairs of the drain contacts among said plurality of drain contacts, the narrow-width silicide region being smaller in a width in a gate length direction than respective regions where said drain contact are formed.

19. The semiconductor device of claim 17,
wherein an insulating sidewall spacer is formed on each side surface of said gate electrode,
a dummy sidewall spacer is formed on each side surface of said dummy gate electrode, and
said narrow-width silicide region is formed on a part of said source regions that is located between said sidewall spacer and said dummy sidewall spacer.

* * * * *

UNITED STATES PATENT AND TRADEMARK OFFICE
CERTIFICATE OF CORRECTION

| | | |
|---|---|---|
| PATENT NO. | : 7,045,863 B2 | Page 1 of 1 |
| APPLICATION NO. | : 11/028581 | |
| DATED | : May 16, 2006 | |
| INVENTOR(S) | : Toshihiro Kogami et al. | |

It is certified that error appears in the above-identified patent and that said Letters Patent is hereby corrected as shown below:

TITLE PAGE,
Item "(56) References Cited", "FOREIGN PATENT DOCUMENTS", change "JP 2-271873 11/1990" to -- JP 2-271673 11/1990 --.

Signed and Sealed this

Fourteenth Day of November, 2006

JON W. DUDAS
*Director of the United States Patent and Trademark Office*